United States Patent
Tang et al.

(10) Patent No.: US 12,444,890 B2
(45) Date of Patent: Oct. 14, 2025

(54) POWER CABLE WITH DIFFERENT TYPES OF CONNECTORS

(71) Applicant: Advanced Micro Devices, Inc., Santa Clara, CA (US)

(72) Inventors: Sixuan Tang, Shanghai (CN); Zhixin Yao, Shanghai (CN); Guangmin He, Shanghai (CN); Weina Liu, Shanghai (CN)

(73) Assignee: Advanced Micro Devices, Inc., Santa Clara, CA (US)

( * ) Notice: Subject to any disclaimer, the term of this patent is extended or adjusted under 35 U.S.C. 154(b) by 113 days.

(21) Appl. No.: 18/373,956

(22) Filed: Sep. 27, 2023

(65) Prior Publication Data

US 2025/0105565 A1 Mar. 27, 2025

(51) Int. Cl.
*H01R 24/28* (2011.01)
*H01B 7/00* (2006.01)
*H01R 107/00* (2006.01)
*H03K 19/20* (2006.01)

(52) U.S. Cl.
CPC ............. *H01R 24/28* (2013.01); *H01B 7/009* (2013.01); *H01R 2107/00* (2013.01); *H01R 2201/06* (2013.01); *H03K 19/20* (2013.01)

(58) Field of Classification Search
CPC ............... H01R 24/28; H01R 2107/00; H01R 2201/06; H01B 7/009; H03K 19/20
USPC ........................................................ 307/151
See application file for complete search history.

(56) References Cited

U.S. PATENT DOCUMENTS

2024/0329701 A1* 10/2024 Han .................. G06F 1/26
2024/0427399 A1* 12/2024 Lin .................. H02H 5/042

OTHER PUBLICATIONS

NZXT, 12VHPWR Adapter Cable Manual, https://nzxt.com/product/12vhpwr-adapter-cable.
ATX 3.0 Power Supply: Connectors, Pinout and Specification, https://www.smpspowersupply.com/atx3connectors.html#google_vignette.

* cited by examiner

*Primary Examiner* — Richard Tan
(74) *Attorney, Agent, or Firm* — Patterson + Sheridan, LLP (57) ABSTRACT

Disclosed herein are a power cable and a power supply system including the power cable. The power cable includes a 12VHPWR connector disposed at a first end of the power cable; a plurality of PCIE 2×4 connectors disposed at a second end of the power cable; and a converting circuit coupled with the 12VHPWR connector via a first cable and coupled with the plurality of the PCIE 2×4 connectors via a plurality of second cables. The converting circuit includes at least one AND gate configured to couple sensing pins of the plurality of PCIE 2×4 connectors with a sensing pin of the 12VHPWR connector.

20 Claims, 8 Drawing Sheets

POWER CABLE WITH DIFFERENT TYPES OF CONNECTORS

TECHNICAL FIELD

Embodiments of the present invention generally relate to a power cable including two different types of connectors and, more particularly, relate to a power cable comprising a Peripheral Component Interconnect Express (PCIE) 12VHPWR connector at one end and a plurality of PCIE 2×4 connectors at another end.

BACKGROUND

Figure 1A:
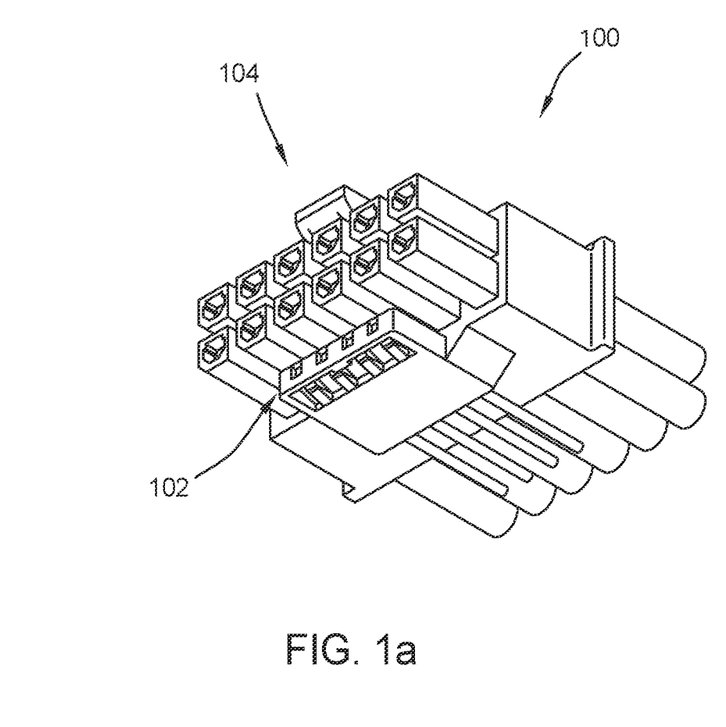
FIG. 1a is a schematic perspective view of a 12VHPWR Connector, according to an embodiment of the present application.
Figure 1B:
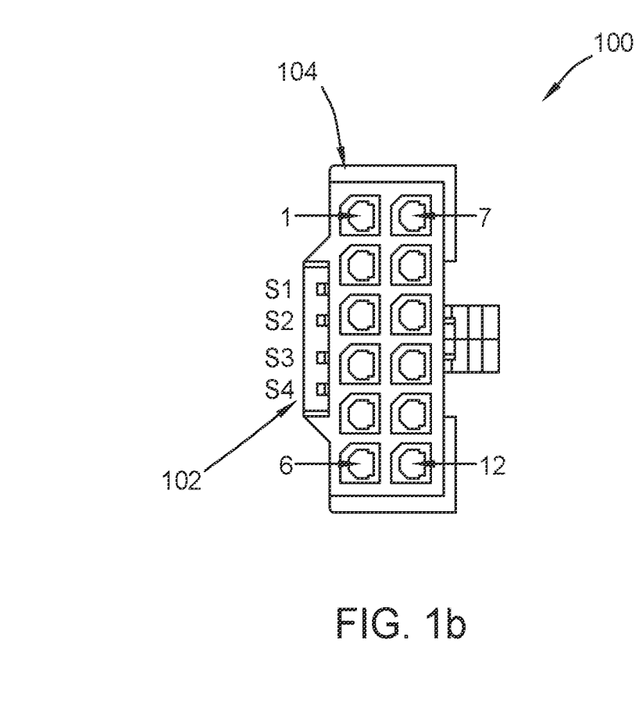
FIG. 1b is a schematic cross-sectional view of the 12VHPWR Connector of FIG. 1a, according to an embodiment of the present application.

Recently developed graphic cards may briefly surge its power consumption up to 3 times of a regular operation. To meet this demand of power surge, an Advanced Technology Extended (ATX) 3.0 power supply specification was developed and introduced in 2022 to support next-generation hardware. The ATX 3.0 specification includes a PCIE 12VHPWR auxiliary power connector ("12VHPWR Connector") to supply 12 Volt power to graphics cards. A PCIE 5.0 The 12VHPWR Connector can provide up to 600 watts to a PCIE 5.0 add-in/graphics card. FIGS. 1a and 1b illustrate pinouts and functions of a 12VHPWR Connector.

Now turning to FIGS. 1a and 1b, the 12VHPWR Connector 100 includes a sideband section 102 containing four sensing pins and a main section 104 containing six COM pins and six power pins arranged in two rows, respectively. The COM pins are configured for data communication, and the power pins are configured for power transmission. The 6 power pins are labeled 1-6, respectively, and the six COM pins are labeled 7-12, respectively. As shown in FIG. 1b, the four sensing pins are labeled S1, S2, S3, and S4, respectively, where S1 and S2 transmit signals from a graphic card to a power supply unit. The sensing pins S3 and S4 provide sensing signals Sense0 and Sense1, respectively, from a power supply unit to a graphic card. A logical combination of Sense0 and Sense1 signals, shown in the table below, tells the graphic card the amount of power that can be drawn.

| Sense0 | Sense1 | Initial Permitted Power at System Power Up | Maximum Sustain Power after Software Configuration |
|---|---|---|---|
| Gnd | Gnd | 375 W | 600 W |
| Open | Gnd | 225 W | 450 W |
| Gnd | Open | 150 W | 300 W |
| Open | Open | 100 W | 150 W |

Hardware configurations complied with earlier power management standards, such as ATX 2.0, have been widely adopted and are not fully compatible with the ATX 3.0 specification. For example, many existing power supply units include PCIE 2×4 auxiliary power connector ("PCIE 2×4 Connector"). A PCIE 2×4 Connector can supply up to 150 Watts per 2×4 auxiliary power connector.

Figure 2A:
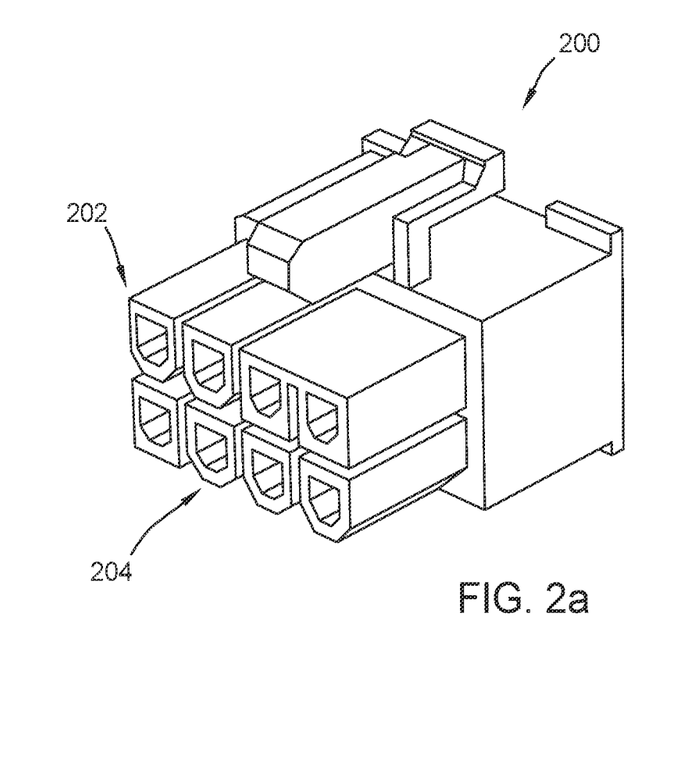
FIG. 2a is a schematic perspective view of a PCIE 2×4 Connector, according to an embodiment of the present application.
Figure 2B:
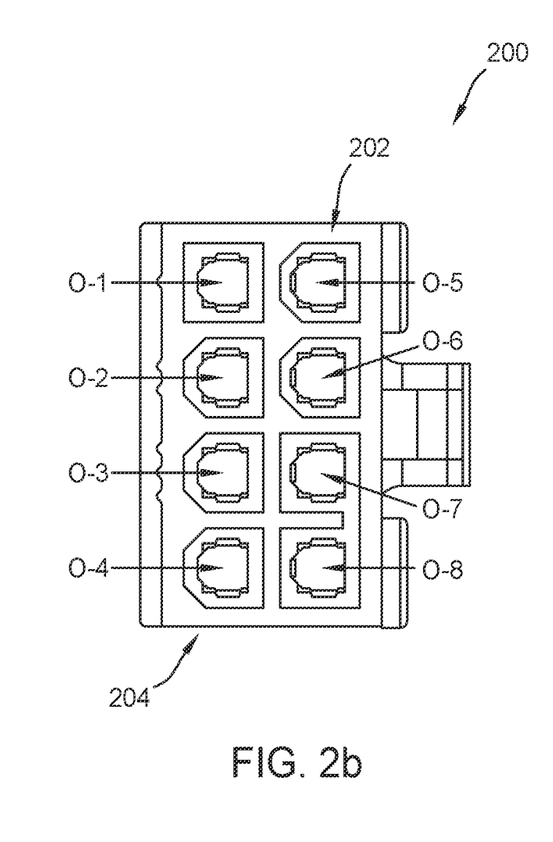
FIG. 2b is a schematic cross-sectional view of the PCIE 2×4 Connector of FIG. 2a, according to an embodiment of the present application.

Shown in FIGS. 2a and 2b, a PCIE 2×4 Connector includes eight pins arranged in two rows 202 and 204. The eight pins include three power pins, O-1, O-2, and O-3; and three COM pins O-5, O-7, and O-8. The eight pins also include two sensing pins: O-4 and O-6 for generate Sense1 and Sense0 signals, respectively. When the PCIE 2×4 Connector is connected to a power supply unit, both O-4 and O-6 pins provide GROUND signals. When the PCIE 2×4 Connector is not connected to a power supply unit, both O-4 and O-6 pins provide OPEN signals. As the pinouts and functions of the PCIE 2×4 Connector 200 are different from the 12VHPWR Connector 100, the existing power supply units with PCIE 2×4 Connectors cannot be used to directly supply powers to the next-generation graphics card.

Therefore, a need exists for an improved power cable that can connect the existing power supply with next-generation graphics cards.

SUMMARY

Disclosed herein are a power cable and a power supply system including the power cable. The power cable includes a 12VHPWR connector disposed at a first end of the power cable; a plurality of PCIE 2×4 connectors disposed at a second end of the power cable; and a converting circuit coupled with the 12VHPWR connector via a first cable and the plurality of the PCIE 2×4 connectors via a plurality of second cables. The converting circuit includes at least one AND gate configured to couple sensing pins of the plurality of PCIE 2×4 connectors with a sensing pin of the 12VHPWR connector.

Disclosed herein is a method of coupling a plurality of PCIE 2×4 connectors with a 12VHPWR connector. The method includes cascading one or more AND gates, coupling the power pins of the plurality of PCIE 2×4 connectors with the power pins of the 12VHPWR connector, and selectively coupling No. 4 and/or 6 sensing pins of the plurality of PCIE 2×4 connector with sensing pins S3 and/or S4 of the 12VHPWR connector via the one or more cascaded AND gates. For example, when two PCIE 2×4 connectors are coupled with the 12VHPWR connector, the one or more cascaded AND gates only couple the No. 6 sensing pins of the two PCIE 2×4 connectors with the sensing pin S3 of the 12VHPWR connector. When three PCIE 2×4 connectors are coupled with the 12VHPWR connector, the one or more cascaded AND gates only couple the No. 4 sensing pins of the three PCIE 2×4 connectors with the sensing pin S4 of the 12VHPWR connector. When four PCIE 2×4 connectors are coupled with the 12VHPWR connector, the one or more cascaded AND gates couple both the No. 6 sensing pins of the four PCIE 2×4 connectors with the sensing pin S3 of the 12VHPWR connector and the No. 4 sensing pins of the four PCIE 2×4 connectors with the sensing pin S4 of the 12VHPWR connector.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Disclosed herein is a power cable including a 12VHPWR connector disposed at a first end and a plurality of PCIE 2×4 connectors disposed at a second end. The power cable further includes a converting circuit coupled with the 12VHPWR connector and the plurality of the PCIE 2×4 connectors. The converting circuit is configured to covert sensing signals provided by the PCIE 2×4 connectors to sensing signals for the 12VHPWR connector. In this way, the power cable allows an existing supply to provide power to recently introduced graphics cards that utilize a 12VHPWR connector to supply power.

The converting circuit processes the sensing signals according to the number of PCIE 2×4 connectors that are used to supply power. When four PCIE 2×4 connectors are used to supply power, the converting circuit generates two GROUND sensing signals for the 12VHPWR connector, which indicates a maximum power of 600 Watts may be drawn. When three PCIE 2×4 connectors are used to supply power, the converting circuit generates an OPEN signal for the S3 sensing pin and a GROUND signal for the S4 sensing pin of the 12VHPWR connector, indicating a maximum power of 450 Watts may be drawn. When two PCIE 2×4 connectors are used to supply power, the converting circuit generates a GROUND signal for the S3 sensing pin and an OPEN signal for the S4 sensing pin of the 12VHPWR connector, indicating a maximum power of 300 Watts may be drawn. According to an embodiment, AND gates are included in the converting circuit to process sensing signals from the PCIE 2×4 connectors.

Figure 3A:
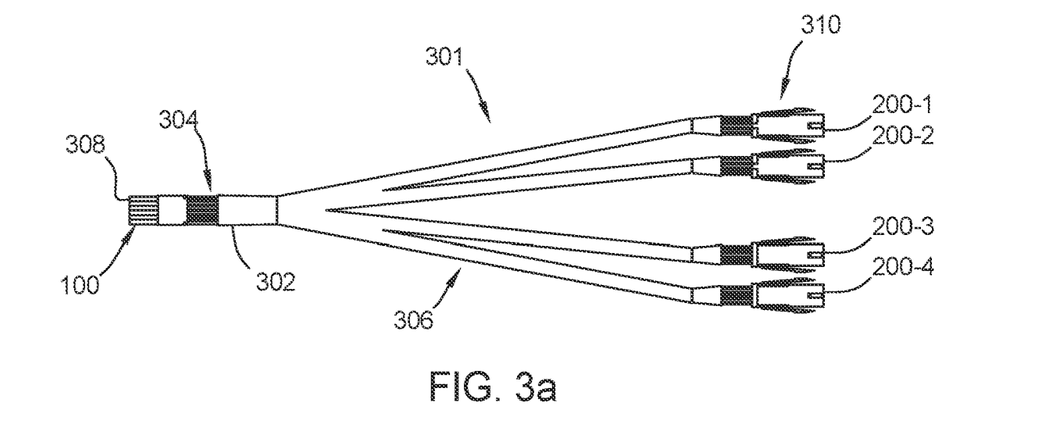
FIG. 3a illustrates a schematic view of a power cable including four PCIE 2×4 Connectors, according to an embodiment of the present application.
Figure 3B:
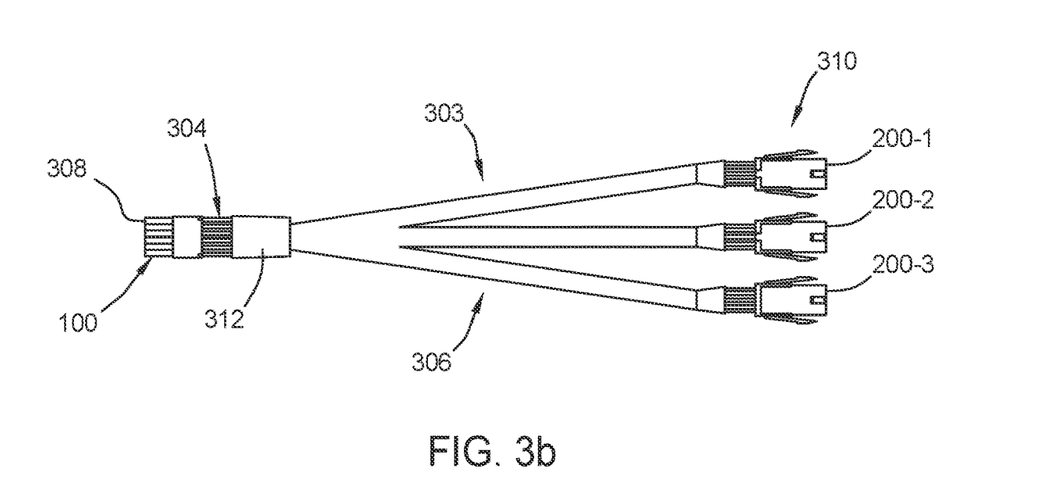
FIG. 3b illustrates a schematic view of a power cable including three PCIE 2×4 Connectors, according to an embodiment of the present application.
Figure 3C:
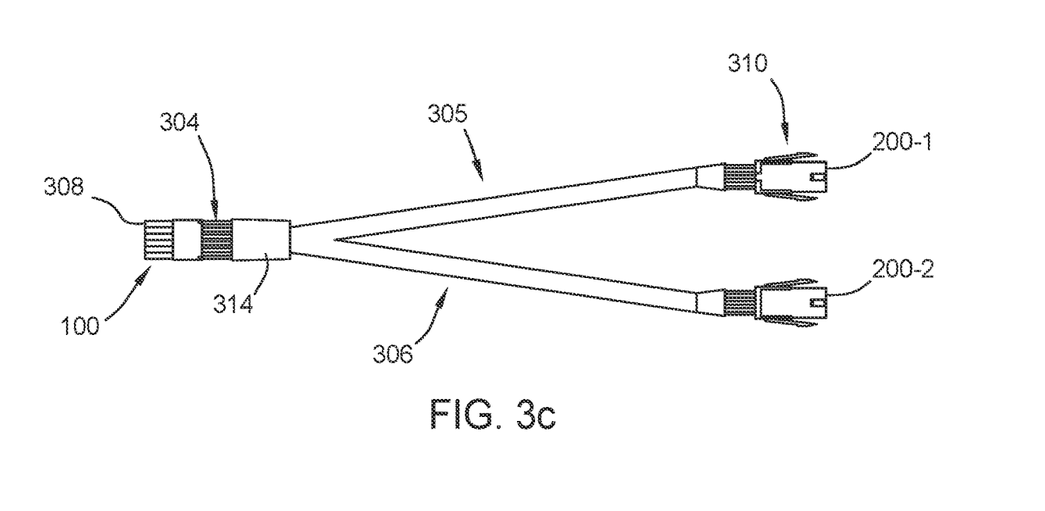
FIG. 3c illustrates a schematic view of a power cable including two PCIE 2×4 Connectors, according to an embodiment of the present application.

Turning now to FIG. 3a, a power cable 301 is provided that includes a 12VHPWR Connector 100 at a first end 308 and four PCIE 2×4 Connectors 200-1, 200-2, 200-3, 200-4 at a second end 310. The power cable 300 may include a greater or less number of PCIE Connectors at the second end 310, such as three or two connectors (FIGS. 3b and 3c). The power cable 301 further includes a converting circuit 302 coupled with the 12VHPWR Connector 100 via a first cable 304 at one end and coupled with the PCIE 2×4 Connectors 200 via a plurality of second cables 306 at another end. The first cable 304 is compatible with the 12VHPWR Connector 100 and includes 16 wires: six for power pins, six for COM pins, and four for sensing pins. Each of the second cables 306 is compatible with the PCIE 2×4 Connector and includes eight wires: three for power pins, three for COM pins, and two for sensing pins. According to an embodiment, the first cable 304 has a higher power rating than each of the second cable 306.

The converting circuit 302 couples the power pins of the PCIE 2×4 Connectors with the power pins of the 12VHPWR Connector. The converting circuit 302 also couples the COM pins of the PCIE 2×4 Connectors with the COM pins of the 12VHPWR Connector. The converting circuit 302 also couples the sensing pins of the PCIE 2×4 Connectors with the sensing pins of the 12VHPWR Connector. According to an embodiment, the converting circuit 302 is configured to process sensing signals provided by the PCIE 2×4 Connectors and generate sensing signals that indicate a first level of maximum power, such as 600 Watts, can be drawn.

FIG. 3b illustrates a power cable 303 including a 12VHPWR Connector 100 at a first end 308 and three PCIE 2×4 Connectors 200-1, 200-2, 200-3 at a second end 310. The power cable 303 further includes a converting circuit 312 coupled with the 12VHPWR Connector 100 and the PCIE 2×4 Connectors 200. The converting circuit 312 couples the power pins and COM pins of the PCIE 2×4 Connectors with those of the 12VHPWR Connector. The converting circuit 312 also couples the sensing pins of the PCIE 2×4 Connectors with the sensing pins of the 12VHPWR Connector. According to an embodiment, the converting circuit 312 is configured to process sensing signals provided by the PCIE 2×4 Connectors and generate sensing signals that indicate a second level of maximum power, such as 450 Watts, can be drawn.

FIG. 3c illustrates a power cable 305 including a 12VHPWR Connector 100 at a first end 308 and two PCIE 2×4 Connectors 200-1, 200-2 at a second end 310. The power cable 305 further includes a converting circuit 314 coupled with the 12VHPWR Connector 100 and the PCIE 2×4 Connectors 200. The converting circuit 314 couples the power pins of the PCIE 2×4 Connectors with the power pins of the 12VHPWR Connector. The converting circuit 312 also couples the sensing pins of the PCIE 2×4 Connectors with the sensing pins of the 12VHPWR Connector. According to an embodiment, the converting circuit 314 is configured to process sensing signals provided by the PCIE 2×4 Connectors and generate sensing signals that indicate a third level of maximum power, such as 300 Watts, can be drawn.

Figure 4A:
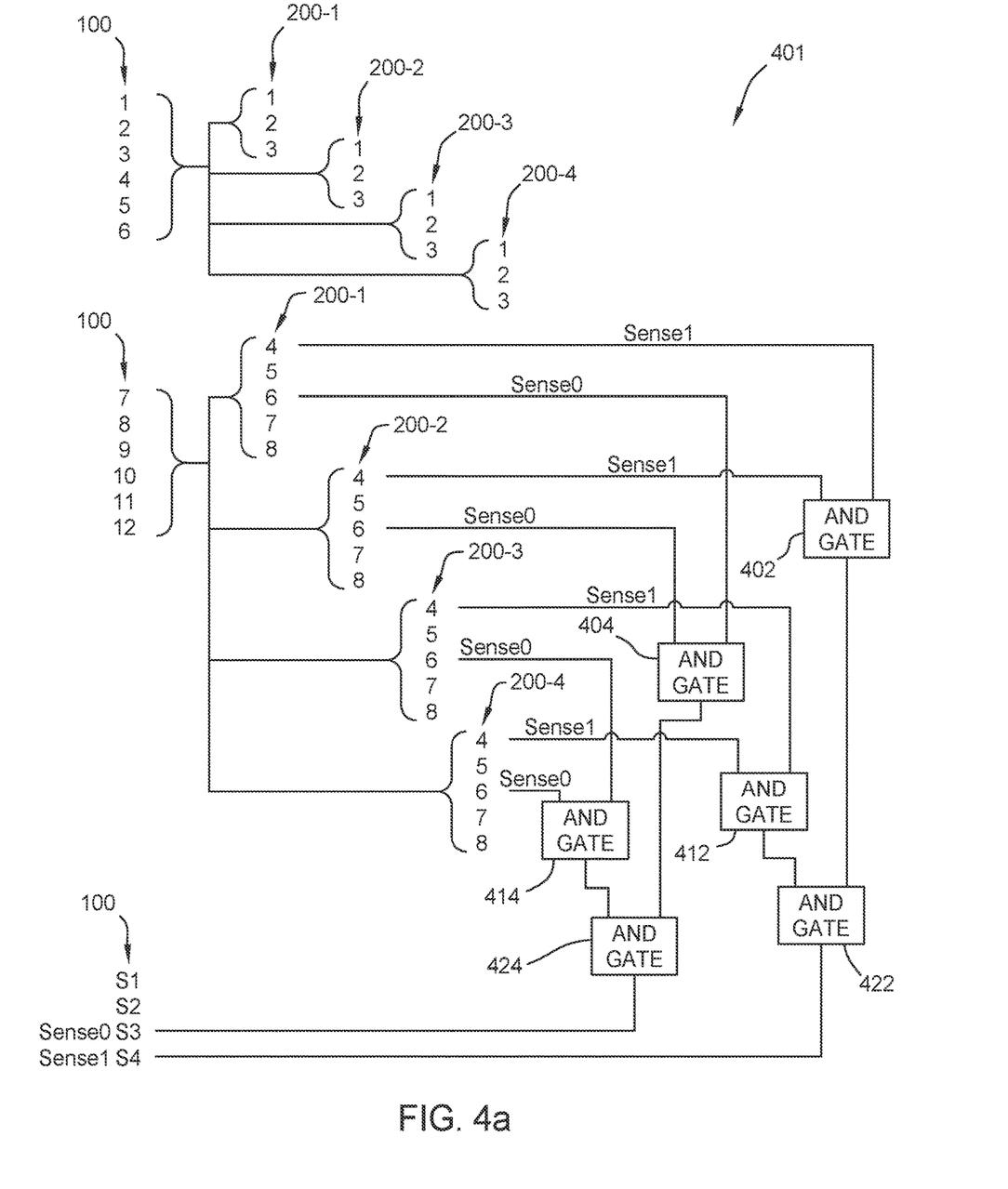
FIG. 4a illustrates a schematic circuit diagram of the power cable of FIG. 3a, according to an embodiment of the present application.

FIG. 4a illustrates a schematic circuit diagram 401 of the power cable 301, according to an embodiment. The circuit diagram 401 shows the electrical connection between a 12VHPWR Connector 100 and four PCIE 2×4 Connectors 200-1, 200-2, 200-3, and 200-4. The power pins Nos. 1-3 of the four PCIE 2×4 Connectors 200-1, 200-2, 200-3, and 200-4 are coupled with the power pins Nos. 1-6 of the 12VHPWR Connector 100. The COM pins Nos. 5, 7, and 8 of the four PCIE 2×4 Connectors 200-1, 200-2, 200-3, and 200-4 are coupled with the COM pins Nos. 7-12 of the 12VHPWR Connector 100.

According to an embodiment, the sensing pin S3 of the 12VHPWR Connector 100 is coupled with No. 6 sensing pins of the PCIE 2×4 Connectors 200-1, 200-2, 200-3, and 200-4. Both the sensing pin S3 and No. 6 sensing pin provide the sensing signal Sense0. A plurality of AND gates arranged in a cascade manner are configured to process the sensing signals Sense0 generated by the PCIE 2×4 Connectors. For example, an AND gate 404 receives sensing signals from No. 6 sensing pins of the PCIE 2×4 Connectors 200-1 and 200-2 and outputs a sensing signal to an AND gate 424. An AND gate 414 receives sensing signals from No. 6 sensing pins of the PCIE 2×4 Connectors 200-3 and 200-4 and outputs a sensing signal to the AND gate 424. The AND gate 424 receives the sensing signals from the AND gates 404 and 414 and outputs another sensing signal to the sensing pin S3 of the 12VHPWR Connector 100.

The sensing pin S4 of the 12VHPWR Connector 100 is coupled with sensing pins No. 4 of the PCIE 2×4 Connectors 200-1, 200-2, 200-3, and 200-4. Both the sensing pin S4 and No. 4 sensing pin provide the sensing signal Sense1. A plurality of AND gates arranged in a cascade manner are configured to process the sensing signals Sense1 generated by the PCIE 2×4 Connectors. For example, an AND gate 402 receives sensing signals from No. 4 sensing pins No. 4 of the PCIE 2×4 Connectors 200-1 and 200-2 and outputs a sensing signal to an AND gate 422. An AND gate 412 receives sensing signals from No. 4 sensing pins of the PCIE 2×4 Connectors 200-3 and 200-4 and outputs a sensing signal to the AND gate 422. The AND gate 422 receives the sensing signals from the AND gates 402 and 412 and outputs another sensing signal to the sensing pin S4 of the 12VHPWR Connector 100.

In operation, when the four PCIE 2×4 Connectors 200-1, 200-2, 200-3, and 200-4 are plugged into a power supply unit, all Nos. 4 and 6 sensing pins transmit GROUND signals. As a result, the sensing signals of both the sensing pins S3 and S4 are GROUND signals, which indicate a maximum power of 600 Watts according to the ATX3.0 standard.

Figure 4B:
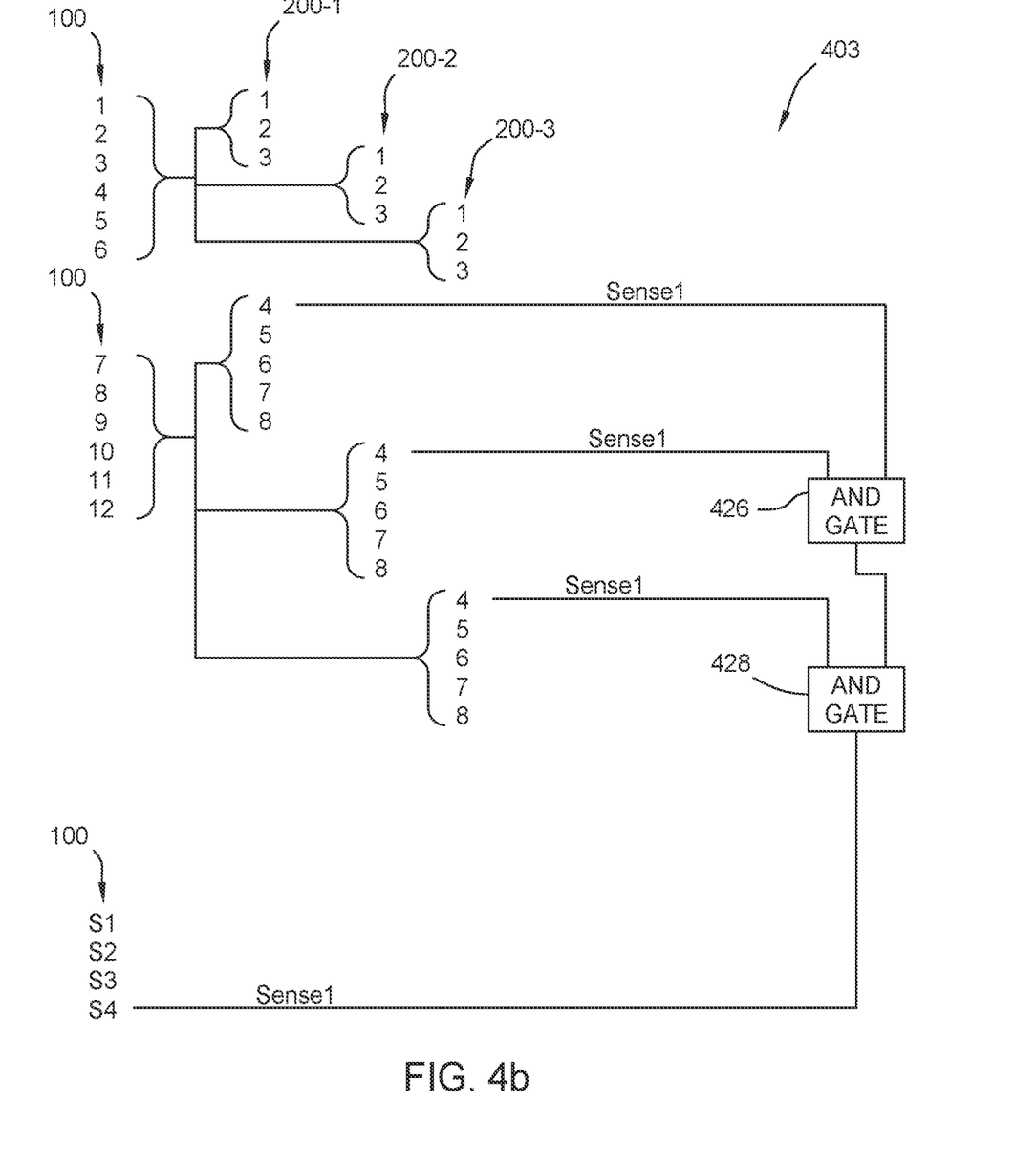
FIG. 4b illustrates a schematic circuit diagram of the power cable of FIG. 3b, according to an embodiment of the present application.

FIG. 4b illustrates a schematic circuit diagram 403 of the power cable 303, according to an embodiment. The circuit diagram 403 shows the electrical connection between a 12VHPWR Connector 100 and three PCIE 2×4 Connectors 200-1, 200-2, and 200-3. The power pins Nos. 1-3 of the three PCIE 2×4 Connectors are coupled with the power pins Nos. 1-6 of the 12VHPWR Connector 100. The COM pins Nos. 5, 7, and 8 of the three PCIE 2×4 Connectors 200-1, 200-2, and 200-3 are coupled with the COM pins Nos. 7-12 of the 12VHPWR Connector 100.

According to an embodiment, the sensing pin S4 of the 12VHPWR Connector 100 is coupled with No. 4 sensing pins of the PCIE 2×4 Connectors. Both the sensing pin S4 and the No. 4 sensing pin provide the sensing signal Sense1. A plurality of AND gates arranged in a cascade manner are configured to process the sensing signals Sense1 generated by the PCIE 2×4 Connectors. For example, an AND gate 426 receives sensing signals from No. 4 sensing pins of the PCIE 2×4 Connectors 200-1 and 200-2 and outputs a sensing signal to an AND gate 428. The AND gate 423 receives sensing signals from No. 4 sensing pin of the PCIE 2×4 Connectors 200-3 and the output signal of the AND gate 426. The AND gate 428 outputs a sensing signal to the sensing pin S4 of the 12VHPWR Connector 100.

The sensing pin S3 of the 12VHPWR Connector 100 is decoupled from sensing pins No. 6 of the PCIE 2×4 Connectors. As a result, the sensing pin S3 has an OPEN sensing signal.

In operation, when the three PCIE 2×4 Connectors 200-1, 200-2, and 200-3 are plugged into a power supply unit, all No. 6 sensing pins produce GROUND signals. As a result, the sensing signal of the sensing pin S4 is a GROUND signal. At the meantime, the sensing signal of the sensing pin S3 is an OPEN signal. Thus, the sensing signals of S3 and S4 indicate a maximum power of 450 Watts according to the ATX3.0 standard.

Figure 4C:
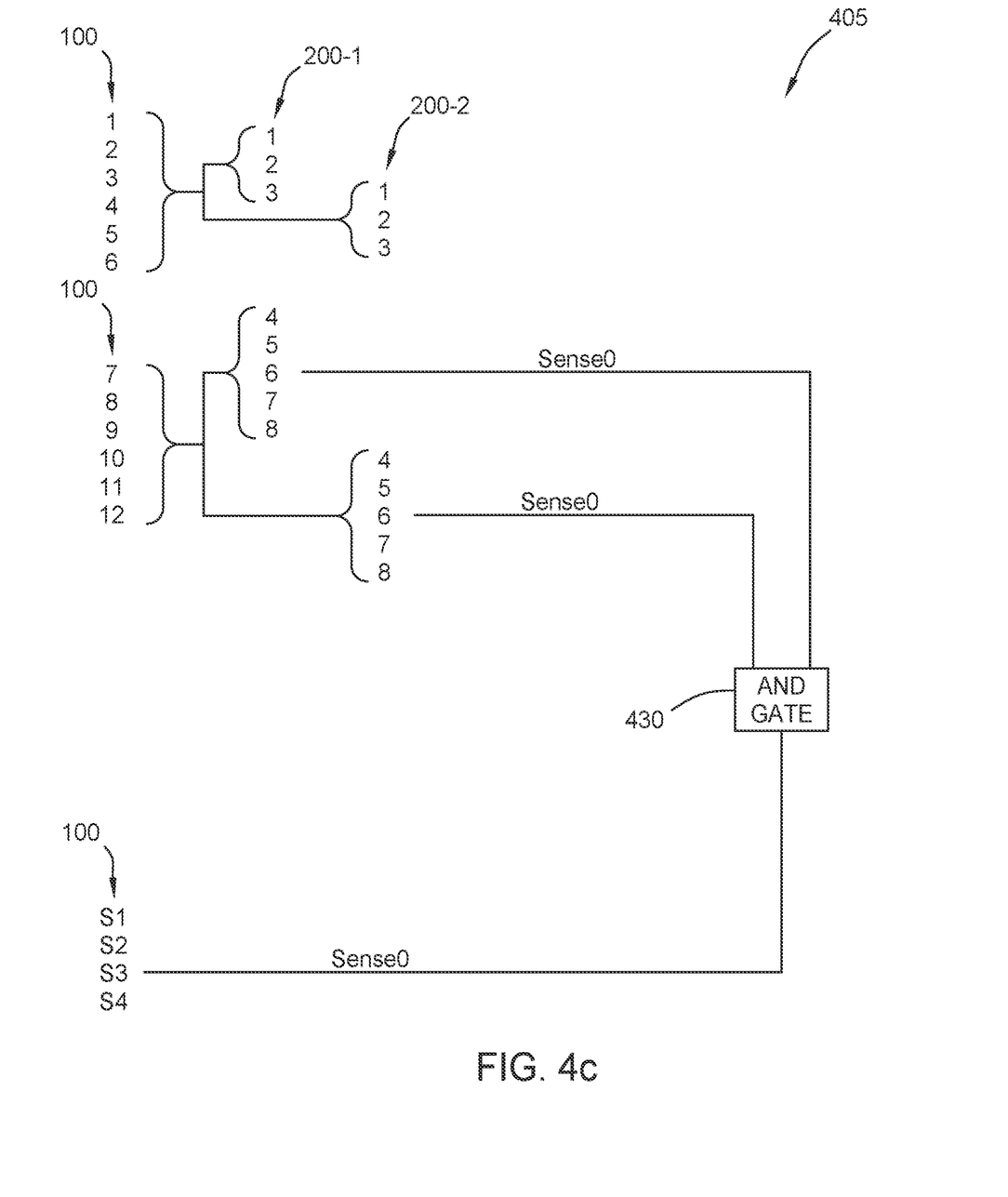
FIG. 4c illustrates a schematic circuit diagram of the power cable of FIG. 3c, according to an embodiment of the present application.

FIG. 4c illustrates a schematic circuit diagram 405 of the power cable 305, according to an embodiment. The circuit diagram 405 shows the electrical connection between a 12VHPWR Connector 100 and two PCIE 2×4 Connectors 200-1, and 200-2. The power pins Nos. 1-3 of the two PCIE 2×4 Connectors are coupled with the power pins Nos. 1-6 of the 12VHPWR Connector 100. The COM pins Nos. 5, 7, and 8 of the two PCIE 2×4 Connectors 200-1, 200-2 are coupled with the COM pins Nos. 7-12 of the 12VHPWR connector 100.

According to an embodiment, the sensing pin S3 of the 12VHPWR Connector 100 is coupled with No. 6 sensing pins of the PCIE 2×4 Connectors. Both the sensing pin S3 and the No. 6 sensing pin provide the sensing signal Sense0. A single AND gate is configured to process the sensing signals Sense0 transmitted by the PCIE 2×4 Connectors. For example, an AND gate 430 receives sensing signals from No. 6 sensing pins of the PCIE 2×4 Connectors 200-1 and 200-2 and outputs a sensing signal to the sensing pin S4 of the 12VHPWR Connector 100.

The sensing pin S4 of the 12VHPWR Connector 100 is decoupled from sensing pins No. 4 of the PCIE 2×4 Connectors. As a result, the sensing pin S4 has an OPEN sensing signal.

In operation, when the two PCIE 2×4 Connectors 200-1 and 200-2 are plugged into a power supply unit, both No. 4 sensing pins transmit GROUND signals. As a result, the sensing signal of the sensing pin S3 is a GROUND signal. In the meantime, the sensing signal of the sensing pin S4 is an OPEN signal. Thus, the sensing signals of S3 and S4 indicate a maximum power of 300 Watts according to the ATX3.0 standard.

Figure 5:
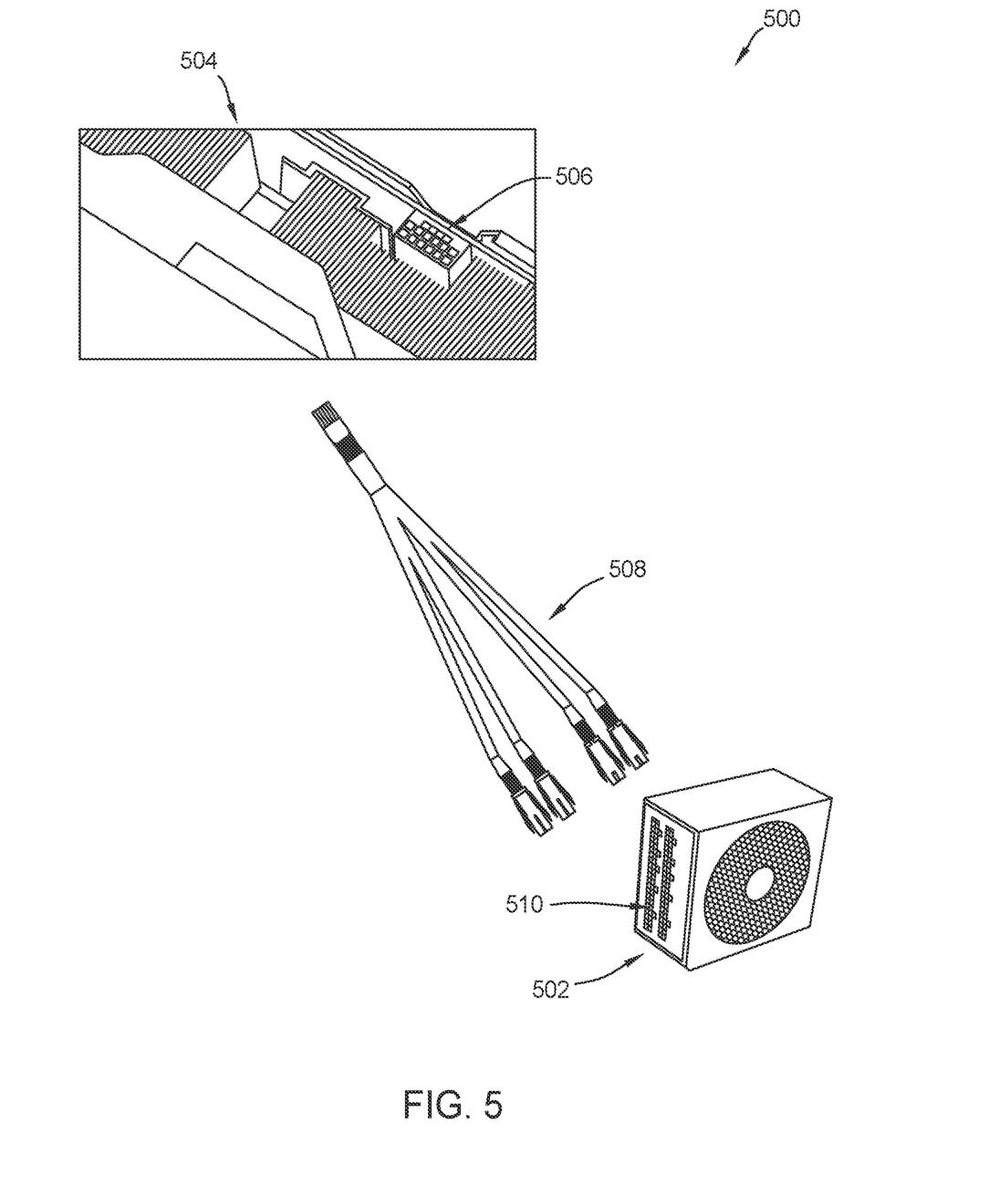
FIG. 5 illustrates a schematic configuration of a power supply system, according to an embodiment of the present application.

Turning now to FIG. 5, a power supply system 500 includes a power supply unit 502, a power cable 508, and an electronic device 504. The power supply unit 502 may be an ATX 2.0 power supply unit or other suitable power supply unit. The electronic device 504 may be a graphics card or other processing unit, such as a PCIE 5.0 desktop graphics cards. The 12VHPWR Connector 100 of the power cable 508 couples with a mating port 506 disposed at the electronic device 504. The PCIE 2×4 Connectors couple with the power supply unit 502 and transmits power from the power supply unit 502 to the power cable 300. The power supply unit 502 includes mating ports 510 that are compatible with the PCIE 2×4 Connectors. The power cable 508 may be anyone of the power cables 301, 303, and 305. The power cable 508 enables an ATX2.0 power supply unit to supply up to 600 Watts of power to the electronic device 504.

Figure 6:
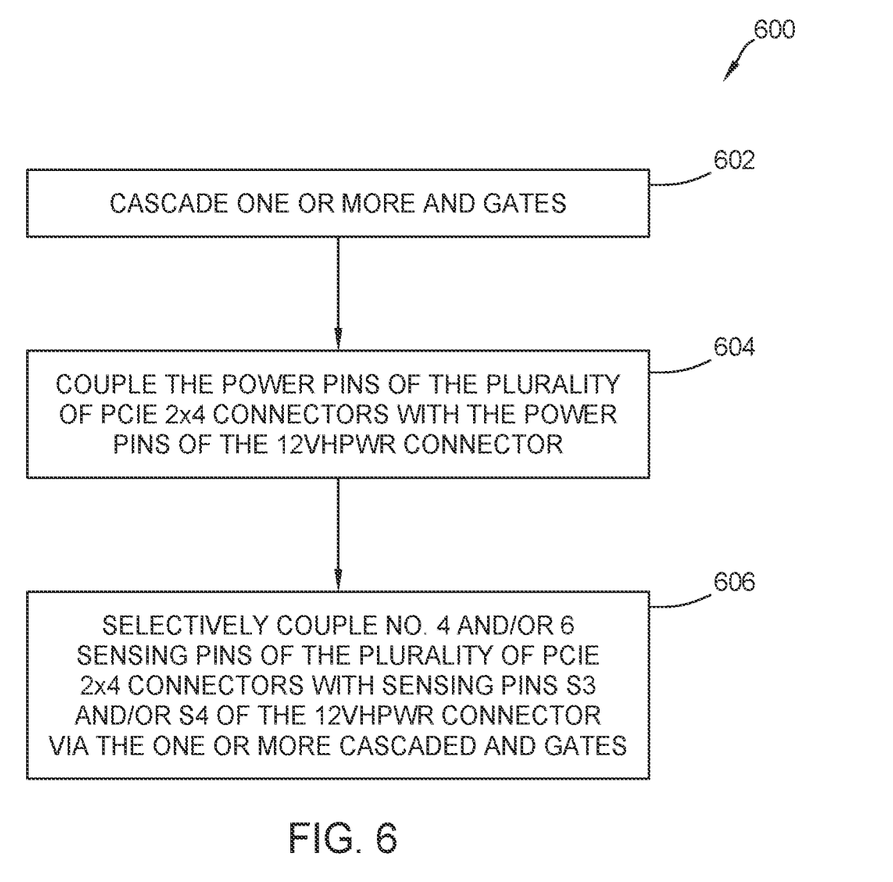
FIG. 6 illustrates a flow chart for coupling a plurality of PCIE 2×4 connectors with a 12VHPWR connector, according to an embodiment of the present application.

FIG. 6 illustrates a method of coupling a plurality of PCIE 2×4 connectors with a 12VHPWR connector, according to an embodiment of the present application. The method 600 includes an operation 602 that cascades one or more AND gates. The one or more AND gates may include one, two, three, or more AND gates. The one or more AND gates are cascaded such that each AND gate receives two inputs from the PCIE 2×4 connectors and provides one output to another AND gate or the 12VHPWR connector.

In operation 604, the power pins of the plurality of PCIE 2×4 connectors are coupled with the power pins of the 12VHPWR connector. For example, the Nos. 1-3 pins of the PCIE 2×4 connectors are directly connected with the Nos. 1-6 pins of the 12VHPWR connector.

In operation 606, No. 4 and/or 6 sensing pins of the plurality of PCIE 2×4 connector are selectively coupled with sensing pins S3 and/or S4 of the 12VHPWR connector via the one or more cascaded AND gates. For example, when two PCIE 2×4 connectors are coupled with the 12VHPWR connector, the one or more cascaded AND gates only couple the No. 6 sensing pins of the two PCIE 2×4 connectors with the sensing pin S3 of the 12VHPWR connector. The No. 4 sensing pins of the two PCIE 2×4 connectors are not coupled with the sensing pin S4 of the 12VHPWR connector. When three PCIE 2×4 connectors are coupled with the 12VHPWR connector, the one or more cascaded AND gates only couple the No. 4 sensing pins of the three PCIE 2×4 connectors with the sensing pin S4 of the 12VHPWR connector. The No. 6 sensing pins of the three PCIE 2×4 connectors are not coupled with the sensing pin S3 of the 12VHPWR connector. When four PCIE 2×4 connectors are coupled with the 12VHPWR connector, the one or more cascaded AND gates couple both the No. 6 sensing pins of the four PCIE 2×4 connectors with the sensing pin S3 of the 12VHPWR connector and the No. 4 sensing pins of the four PCIE 2×4 connectors with the sensing pin S4 of the 12VHPWR connector.

While the foregoing is directed to embodiments of the present invention, other and further embodiments of the invention may be devised without departing from the basic scope thereof, and the scope thereof is determined by the claims that follow.

What is claimed is:

1. A power cable comprising:
    a 12VHPWR connector disposed at a first end of the power cable;
    a plurality of PCIE 2×4 connectors disposed at a second end of the power cable; and
    a converting circuit coupled with the 12VHPWR connector via a first cable and coupled with the plurality of the PCIE 2×4 connectors via a plurality of second cables, the converting circuit comprising at least one AND gate configured to couple sensing pins of the plurality of PCIE 2×4 connectors with a sensing pin of the 12VHPWR connector.

2. The power cable of claim 1, wherein:
    the plurality of the PCIE 2×4 connectors consist of two PCIE 2×4 connectors;
    the at least one AND gate couples sensing pins of the two PCIE 2×4 connectors for providing a Sense0 signal to a sensing pin of the 12VHPWR connector for providing the Sense0 signal; and
    the converting circuit decouples a sensing pin of the 12VHPWR connector that provides a Sense1 signal from sensing pins of the two PCIE 2×4 connectors that provide the Sense1 signal.

3. The power cable of claim 1, wherein:
    the plurality of the PCIE 2×4 connectors consist of three PCIE 2×4 connectors;
    the converting circuit includes two cascaded AND gates configured to couple sensing pins of the three PCIE 2×4 connectors for providing a Sense1 signal with a sensing pin of the 12VHPWR connector for providing the Sense1 signal; and
    the converting circuit decouples a sensing pin of the 12VHPWR connector that provides a Sense0 signal from sensing pins of the three PCIE 2×4 connectors that provide the Sense0 signal.

4. The power cable of claim 1,
    wherein the plurality of the PCIE 2×4 connectors consist of four PCIE 2×4 connectors, and the converting circuit includes a plurality of cascaded AND gates.

5. The power cable of claim 4, wherein the plurality of AND gates include a first group of AND gates coupled with a sensing pin S3 of the 12VHPWR connector and a second group of AND gates coupled with a sensing pin S4 of the 12VHPWR connector.

6. The power cable of claim 5, wherein the first group of AND gates are coupled with No. 6 sensing pins of the four PCIE 2×4 connectors.

7. The power cable of claim 6, wherein the second group of AND gates are coupled with No. 4 sensing pins of the four PCIE 2×4 connectors.

8. The power cable of claim 7, wherein the plurality of the AND gates are configured to provide GROUND signals to sensing pins S3 and S4 of the 12VHPWR connector when the four PCIE 2×4 connectors are plugged into a power supply unit.

9. The power cable of claim 1, wherein the first cable includes 16 wires.

10. The power cable of claim 9, wherein each of the second cables includes 8 wires.

11. The power cable of claim 1, wherein the converting circuit couples power pins of the at least one PCIE 2×4 connector with power pins of the 12VHPWR connector.

12. The power cable of claim 11, wherein the converting circuit couples COM pins of the at least one PCIE 2×4 connector with COM pins of the 12VHPWR connector.

13. A power supply system comprising:
    a power supply unit comprising output ports configured to mate with PCIE 2×4 connectors; and
    a power cable comprising:
        a 12VHPWR connector disposed at a first end of the power cable;
        a plurality of PCIE 2×4 connectors disposed at a second end of the power cable and connected to the output ports of the power supply unit; and
        a converting circuit coupled with the 12VHPWR connector via a first cable and coupled with the plurality of the PCIE 2×4 connectors via a plurality of second cables,
    wherein the converting circuit comprises at least one AND gate configured to couple sensing pins of the plurality of PCIE 2×4 connectors with a sensing pin of the 12VHPWR connector.

14. The power supply system of claim 13, wherein:
    the plurality of the PCIE 2×4 connectors consist of two PCIE 2×4 connectors;
    the at least one AND gate couples sensing pins of the two PCIE 2×4 connectors for providing a Sense0 signal with a sensing pin of the 12VHPWR connector for providing the Sense0 signal; and
    the converting circuit decouples a sensing pin of the 12VHPWR connector that provides a Sense1 signal from sensing pins of the two PCIE 2×4 connectors that provide the Sense1 signal.

15. The power supply system of claim 13, wherein:
    the plurality of the PCIE 2×4 connectors consist of three PCIE 2×4 connectors;
    the converting circuit includes two cascaded AND gates configured to couple sensing pins of the plurality of PCIE 2×4 connectors for providing a Sense1 signal with a sensing pin of the 12VHPWR connector for providing the Sense1 signal; and the converting circuit decouples a sensing pin of the 12VHPWR connector that provides a Sense0 signal from sensing pins of the three PCIE 2×4 connectors that provide the Sense0 signal.

16. The power supply system of claim 13, wherein the plurality of the PCIE 2×4 connectors consist of four PCIE 2×4 connectors, and the converting circuit includes a plurality of cascaded AND gates.

17. The power supply system of claim 16, wherein the plurality of AND gates include a first group of AND gates coupled with a sensing pin S3 of the 12VHPWR connector and a second group of AND gates coupled with a sensing pin S4 of the 12VHPWR connector.

18. The power supply system of claim 17, wherein the first group of AND gates are coupled with No. 6 sensing pins of the four PCIE 2×4 connectors.

19. The power supply system of claim 18, wherein the second group of AND gates are coupled with No. 4 sensing pins of the four PCIE 2×4 connectors, and wherein the plurality of the AND gates are configured to provide GROUND signals to sensing pins S3 and S4 of the 12VHPWR connector when the four PCIE 2×4 connectors are plugged into a power supply unit.

20. A method of coupling a plurality of PCIE 2×4 connectors with a 12VHPWR connector, comprising:
cascading one or more AND gates;
coupling power pins of the plurality of PCIE 2×4 connectors with power pins of the 12VHPWR connector; and
selectively coupling No. 4 and/or 6 sensing pins of the plurality of PCIE 2×4 connector with sensing pins S3 and/or S4 of the 12VHPWR connector via the one or more cascaded AND gates,
wherein:
when two PCIE 2×4 connectors are coupled with the 12VHPWR connector, the one or more cascaded AND gates only couple the No. 6 sensing pins of the two PCIE 2×4 connectors with the sensing pin S3 of the 12VHPWR connector;
when three PCIE 2×4 connectors are coupled with the 12VHPWR connector, the one or more cascaded AND gates only couple the No. 4 sensing pins of the three PCIE 2×4 connectors with the sensing pin S4 of the 12VHPWR connector; and
when four PCIE 2×4 connectors are coupled with the 12VHPWR connector, the one or more cascaded AND gates couple both the No. 6 sensing pins of the four PCIE 2×4 connectors with the sensing pin S3 of the 12VHPWR connector and the No. 4 sensing pins of the four PCIE 2×4 connectors with the sensing pin S4 of the 12VHPWR connector.

* * * * *